(12) United States Patent  
Manninen et al.

(10) Patent No.: US 9,953,893 B2
(45) Date of Patent: Apr. 24, 2018

(54) POWER ELECTRONIC ASSEMBLY

(71) Applicant: ABB Technology Oy, Helsinki (FI)

(72) Inventors: Jorma Manninen, Vantaa (FI); Pirkka Myllykoski, Helsinki (FI)

(73) Assignee: ABB Technology Oy, Helsinki (FI)

( * ) Notice: Subject to any disclaimer, the term of this patent is extended or adjusted under 35 U.S.C. 154(b) by 0 days.

(21) Appl. No.: 15/341,773

(22) Filed: Nov. 2, 2016

(65) Prior Publication Data
US 2017/0125321 A1 May 4, 2017

(30) Foreign Application Priority Data

Nov. 2, 2015 (EP) .................................... 15192481

(51) Int. Cl.
H01L 23/36 (2006.01)
H01L 23/42 (2006.01)
(Continued)

(52) U.S. Cl.
CPC ...... *H01L 23/3672* (2013.01); *H01L 21/4882* (2013.01); *H01L 23/3735* (2013.01);
(Continued)

(58) Field of Classification Search
CPC ............. H01L 23/3672; H01L 23/3735; H01L 23/3736; H01L 23/3737; H01L 23/42; H01L 25/07; H01L 25/50; H01L 29/7393
See application file for complete search history.

(56) References Cited

U.S. PATENT DOCUMENTS 5,291,371 A * 3/1994 Gruber ................... F28F 13/00
174/16.3
5,591,034 A * 1/1997 Ameen ............... H01L 23/3737
257/E23.107

(Continued)

FOREIGN PATENT DOCUMENTS

DE 3025964 A1 2/1982
EP 2849221 A1 3/2015

OTHER PUBLICATIONS

European Search Report, EP15192481, ABB Technology Oy, dated Apr. 8, 2016, 5 pages.

Primary Examiner — Ida M Soward
(74) Attorney, Agent, or Firm — Taft Stettinius & Hollister LLP

(57) ABSTRACT

A method of producing a power electronic assembly and a power electronic assembly including a power electronic module incorporating multiple of semiconductor power electronic switch components, the power electronic module including a base plate with a bottom surface, the power electronic assembly includes further a cooling arrangement for cooling the power electronic module, the cooling arrangement including a cooling surface adapted to be attached against the bottom surface of the base plate of the power electronic module, wherein the power electronic assembly includes further a thermal interface material arranged between the bottom surface of the base plate of the power electronic module and the cooling surface of the cooling arrangement to transfer heat from the power electronic module to the cooling arrangement, the thermal interface material includes a metal foil and a solid lubricant coating.

19 Claims, 2 Drawing Sheets

(51) Int. Cl.
*H01L 25/07* (2006.01)
*H01L 29/73* (2006.01)
*H01L 23/367* (2006.01)
*H01L 21/48* (2006.01)
*H01L 23/373* (2006.01)
*H01L 25/00* (2006.01)
*H01L 29/739* (2006.01)

(52) U.S. Cl.
CPC ...... *H01L 23/3736* (2013.01); *H01L 23/3737* (2013.01); *H01L 23/42* (2013.01); *H01L 25/07* (2013.01); *H01L 25/50* (2013.01); *H01L 29/7393* (2013.01)

(56) References Cited

U.S. PATENT DOCUMENTS

| | | | |
|---|---|---|---|
| 5,774,336 A | 6/1998 | Larson | |
| 6,113,730 A * | 9/2000 | Ohya | H01L 21/4846 156/288 |
| 7,147,041 B2 * | 12/2006 | Mitchell | H01L 23/367 165/185 |
| 7,190,072 B2 * | 3/2007 | Kanda | G06K 19/07749 156/73.1 |
| 7,763,489 B2 * | 7/2010 | Chen | G02B 26/0833 257/E29.324 |
| 2005/0128706 A1 * | 6/2005 | Maly | H01L 23/427 361/699 |
| 2007/0139862 A1 * | 6/2007 | Tateishi | H01G 9/038 361/502 |
| 2010/0238627 A1 * | 9/2010 | Shinohara | H01L 23/3107 361/695 |
| 2010/0290490 A1 * | 11/2010 | Hammel | H01L 23/3735 372/36 |
| 2011/0261535 A1 * | 10/2011 | Izutani | H01L 23/3737 361/708 |
| 2013/0094165 A1 * | 4/2013 | Yano | H01L 25/07 361/784 |
| 2013/0148314 A1 * | 6/2013 | Hirai | H05K 7/06 361/748 |
| 2013/0328184 A1 * | 12/2013 | Iwayama | H01L 23/15 257/712 |
| 2015/0008574 A1 * | 1/2015 | Gohara | H01L 23/473 257/714 |
| 2016/0035660 A1 * | 2/2016 | Terasaki | B32B 15/01 174/252 |
| 2016/0197259 A1 * | 7/2016 | Boukai | H01L 35/32 136/205 |

* cited by examiner

POWER ELECTRONIC ASSEMBLY

FIELD OF THE INVENTION

The present invention relates to power electronics components, and more particularly to thermal interface materials to be used in connection with power electronics components.

BACKGROUND OF THE INVENTION

Power electronic modules are widely used components in which multiple of power electronic switches or devices are placed in a single module. The switches of a power electronic module are wired inside the module in specified manner such that power electronic modules can be used in different circuit structures. Such circuit structures are, for example, power stages of different power converters. For that purpose, the power electronic modules may comprise different half-bridge, full bridge or other bridge topologies in which controllable switch components are internally connected with power diodes. The power electronic modules comprise also terminals, such as control terminals and power terminals that allow connecting the modules to other required circuitry and possibly to other modules.

The components inside a power electronic module are typically mounted on a substrate that is thermally connected to the base plate of the module. The base plate is a metallic piece integrated to the bottom of the module and it is intended to be attached to a surface of a cooling member, such as heat sink. The semiconductor switches inside the modules generate heat when the switches are operated. The switched currents can be over hundreds or even thousands of amperes and the voltage blocking ability of the power semiconductors of the module is several thousand volts. These semiconductor switches are further operated at a relatively high frequency of several thousand Hertz.

A proper thermal design is crucial for a reliable operation of power electronic modules. A violation of the temperature ratings can lead to a reduced safe operating area and consequently a sudden device failure or to a reduced operational lifetime. For example, IEC 60747-9 gives a range of temperature ratings for IGBTs like storage temperature, case temperature and virtual junction temperature. To keep the temperature of the module at a tolerable range, it is known to attach the module to a heat sink. This is performed by attaching the planar surface of the base plate or of the substrate to a corresponding planar surface of a heat sink. The heat transfer between the bottom surface of the module and the heat sink is enhanced by using a thermal interface material (TIM). Such material or layer is placed between the surfaces of base plate and heat sink or surfaces of substrate and heat sink if the module is without a base plate.

Thermal connection between two surfaces depends on several properties including their surface roughness (Ra) and surfaces' planarity. In practice the contact of two surfaces is imperfect and there are gaps filled with air in between them. Because air is poor thermal conductor the contact thermal resistance (Rth) can be reduced by making the contact surfaces perfectly smooth and planar (very expensive) and/ or by replacing the air by a better thermal conducting substance.

Specific materials have been developed to fill air gaps between the surfaces in contact and to reduce contact thermal resistance. These thermal interface materials are available in different physical forms like dispensable grease or paste, various thickness rubber like pads, metal foils and so on. These materials are typically mixtures that include carrier or substrate chemical (like silicone oil or rubber) that has been filled with higher thermal conducting material like boron nitride or carbon nanotubes. Some TIMs have also phase changing property, which may be beneficial for example in cyclic operation applications. This type of TIM is proven to work well in many applications where the contact surface area is relatively small and planar like with cooling of CPUs. Another working solution for CPUs and similar small footprint and planar surfaces is the use of graphite thermal interface materials. Known graphite TIMs have high temperature conductivity and are suitable for small footprint devices due to hardness of the material.

However, the base plate footprint size of PE modules is several times larger compared to CPU's footprint size. Also the base plate surface profile is far from planar in power electronic modules. The base plate's deviation from flatness may exceed 0.1 mm (>100 µm) over 50 mm length. This initial out-of-planarity causes uneven contact pressure at module mounting. Temperature gradient, power cycling and coefficient of thermal expansion differences within the materials of PE module cause dynamic variation to the thermal interface shape. This dynamic behavior causes complex deformation scenario to the thermal interface, which loads the TIM, and in many cases destroys TIM's capability to carry out the heat conduction function. For greases this means "pump-out" where grease is leaking away and for foils this means rupture and dropping pieces of foil. The above power cycling refers to uses of the power electronic module in which the loading of the module is periodical. The periodical or cyclic loading means further that the temperature of the module changes according to the cyclic loading.

As during the power cycling shear stresses are applied to the thermal interface material, the thermal interface material breaks down and loses its ability to conduct the heat effectively from the base plate to the cooling arrangement. This in turn leads to increase of temperature of the switching components and to premature breakdown of the components.

BRIEF DESCRIPTION OF THE INVENTION

An object of the present invention is to provide a power electronic assembly and a method for producing the assembly so as to solve the above problems. The objects of the invention are achieved by an assembly and method which are characterized by what is stated in the independent claims. The preferred embodiments of the invention are disclosed in the dependent claims.

The invention is based on the idea of employing a sheet or a foil of metal together with a layer of solid lubricant coating as a thermal interface material or sheet between base plate of a semiconductor module and the cooling surface of a cooling arrangement.

A thermal interface material layer consisting of metal sheet or foil together with a layer of lubricant coating enables the thermal interface material to withstand deformation of the base plate during highly cyclic loading of the semiconductor module. Further, the solid lubrication layer helps in installation of the thermal interface material as lubrication helps in relieving mechanical stresses caused during the installation phase.

The main material of the thermal interface material is metal, for example aluminium, and the layer of solid lubricant material is preferably a carbon based material, such as graphite, or polytetrafluoroethylene (PTFE), which is best known with its commercial name Teflon which is a trademark of Du-Pond. The lubricant layer may be applied either to the bottom of the base plate or to the top surface of the metal sheet or foil. In both cases the lubricant layer is situated against the base plate of the power semiconductor module and between the metal layer of the thermal interface and the base plate.

Metal, preferably aluminium sheet with a lubricant layer is also very cost-effective structure as the manufacture of such a sheet is easy and the unit cost is relatively low.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
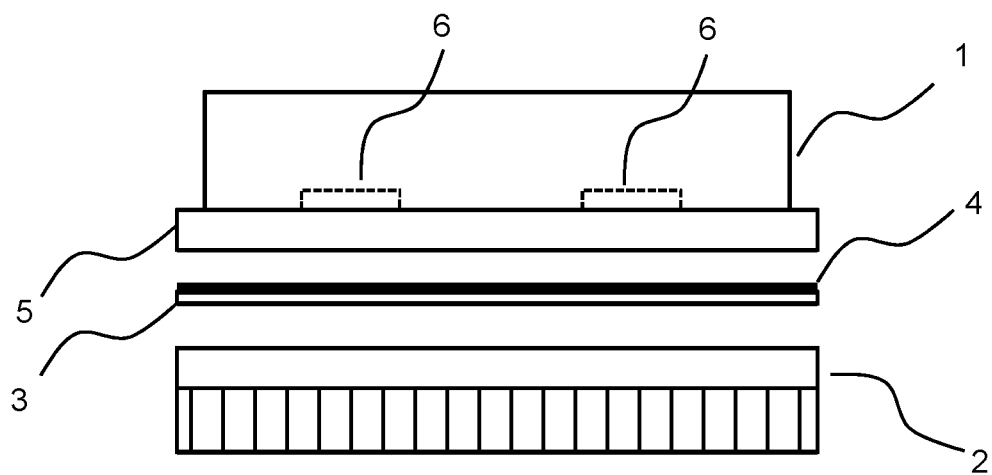
FIG. 1 shows a basic structure of a power electronic assembly of an embodiment of the invention with parts of the structure separated.
Figure 2:
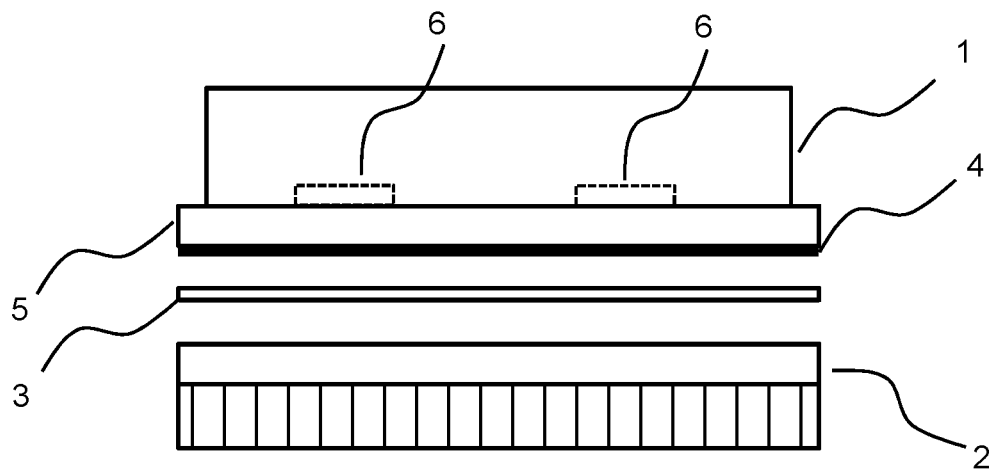
FIG. 2 shows a basic structure of a power electronic assembly of an embodiment of the invention with parts of the structure separated.
Figure 3:
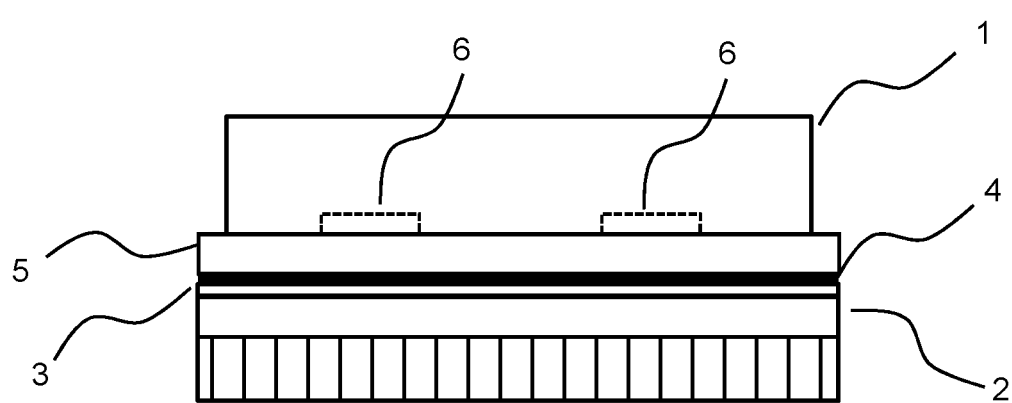
FIG. 3 shows the basic structure of the embodiments of FIGS. 1 and 2 as assembled.

FIGS. 1 and 2 show a basic structure of a power electronic assembly according to an embodiment. In FIGS. 1 and 2 the main parts of the structure are shown as separated from each other whereas in FIG. 3, the assembly is completed. The power electronic assembly comprises a power electronic module 1, cooling arrangement 2 and a thermal interface material comprising a metal foil 3 and a layer of solid lubricant 4. The power electronic module is a component enclosing multiple of power electronic switches 6. Such modules are used in building power electronic devices which large currents are switched and which use high voltages. Typical way of operating such power semiconductor switches 6 is to have the component 6 either fully conducting or blocking such that current is flowing through the component 6 only when the voltage across the component 6 is close to zero. Although the components 6 are controlled in such a manner that losses are minimized, some losses are incurring both during the switching instants and during conduction. The losses of the switch components 6 cause the module to generate heat which can be detrimental to the components 6 if not removed from the module. The FIGS. 1, 2 and 3 are presented as examples for better understanding the idea of the invention. It should be noted that the FIGS. 1, 2 and 3 do not present the components of the assembly in scale. For example, the metal foil of the thermal interface material 3 is shown as a thick block and the solid lubricant layer as a thick line in the Figures for illustrative purposes.

For removing the heat from the modules, the modules are typically structured internally in such a manner that the heat is conveyed to the base plate 5 of the module and the temperature of the switch components 6 can be kept within allowable limits by removing the heat from the component 6 through the base plate 5. The base plate 5 is integral part of the module and is typically metallic to enable to transfer heat via the base plate 5. The physical length of the base plate 5 is in the range of hundreds of millimeters.

For removal of the heat the base plate 5 is mechanically connected to a mating surface of a cooling arrangement. The cooling arrangement thus has a surface that can receive the heat from the power electronic module and to further transfer the heat to a heat transfer medium, which may be liquid or air. In liquid cooled cooling arrangements a cooling liquid is flowing in channels or piping inside a metallic block near the cooling surface. In air cooled cooling arrangements the cooling arrangement comprises a large surface area in connection with surrounding air. The heat is removed to the surrounding air from the surface of the cooling arrangement and typically a large surface are is obtained by using fins or ribs and the removal of heat may be increased by using blowers to keep the air moving in the fins or ribs.

According to the present invention, the power electronic assembly comprises a thermal interface material arranged between the bottom surface of the base plate 5 of the power electronic module and the cooling surface of the cooling arrangement to transfer heat from the power electronic module to the cooling arrangement, the thermal interface material comprises a metal foil and a solid lubricant coating. The solid lubricant coating is applied such that the coating is between the bottom surface of the base plate 5 of the power electronic module and the metal foil of the thermal interface material. In the example of FIG. 1 the solid lubricant layer 4 is attached to the metal foil 3. In the example of FIG. 2 the solid lubricant layer 4 is attached to the bottom surface of the base plate 5. In both above embodiments the lubricant layer 4 lubricates the connection between the metal foil and the base plate 5 such that shear forces produced by the temperature variations are not able to tear the metal foil.

The metal foil of the thermal interface layer is preferably aluminium based foil and typically foil of aluminium. Aluminium has good thermal properties and comparatively easily obtainable and therefore suitable to be used as thermal interface material.

The solid lubricant layer is a coating preferably manufactured from carbon based material, such as graphite. Another example of suitable solid lubricant material is polytetrafluoroethylene (PTFE). The solid lubricant coating forms a layer between the metal foil and the base plate 5 of the power semiconductor module. As presented in the examples of FIG. 1 and FIG. 2, the solid lubricant coating may be applied either to the surface of the metal foil or to the surface of the base plate 5 such that the lubricant layer is between the metal foil and the base plate 5 as shown in FIG. 3.

The metal foil of the invention is in a form of a separate layer when the lubricant coating is applied to the bottom of the base plate 5. When the lubricant coating is applied to the metal foil, then the coated metal foil is in a form of a separate layer. The thickness of the metal foil, such as aluminium foil, is preferably in the range of 100 μm to 300 μm. The thickness of the lubricant coating layer, such as graphite or PTFE layer, is preferably in the range of 5 μm to 20 μm.

The solid lubricant layer stays in the solid form during the use of the thermal interface material. The coating layer has good lubrication properties compared to the metal foil and allows the thermal interface material to withstand mechanical forces related to deformation of the power electronic module during assembly and operation. The properties of the lubricant coating layer enables the metal foil to stay in place without tearing into pieces.

The power electronic assembly is typically employed in a power electronic device. The power electronic device of the invention comprises one or more power electronics assemblies of the invention. A power electronic device is, for example, a converter, an inverter, a frequency converter or any other high-power device. Typically a power electronics device is a device that outputs controlled voltage or current to be supplied to a load. The power electronic assembly contains electrical terminals, such as control terminals and output terminals, with which the power electronics assembly can be coupled to other circuit structures and to enable operation of the circuit.

The method of the invention enables to produce the power electronic assembly. In the method, a power electronic module and a cooling arrangement are provided. The power electronic module comprises a base plate 5 and the cooling arrangement comprises a cooling surface. In the method, a thermal interface material comprising a metal foil and a solid lubricant coating is provided between the bottom surface of the power electronic module and the cooling surface of the cooling arrangement.

The power electronic module is further fastened to the cooling arrangement using fastening means. The fastening means are preferably screws or bolts with which components of the assembly are held firmly together. The screws or bolts are tightened to a specified torque which depends on the module and is typically given by the manufacturer of the power electronic module. Typically the power electronic module comprises through holes through which bolts can be assembled. The cooling arrangement has corresponding threaded holes to which the bolts can attach such that the mating surfaces are firmly against each other. The assembly of the invention does not require any modifications to the base plate 5, cooling surface or to fastening of the module and the cooling arrangement.

It will be obvious to a person skilled in the art that, as the technology advances, the inventive concept can be implemented in various ways. The invention and its embodiments are not limited to the examples described above but may vary within the scope of the claims.

The invention claimed is:

1. A power electronic assembly comprising a power electronic module incorporating multiple of semiconductor power electronic switch components, the power electronic module comprising a base plate with a bottom surface,
   the power electronic assembly comprises further a cooling arrangement for cooling the power electronic module, the cooling arrangement comprising a cooling surface adapted to be attached against the bottom surface of the base plate of the power electronic module, wherein
   the power electronic assembly comprises further a thermal interface material arranged between the bottom surface of the base plate of the power electronic module and the cooling surface of the cooling arrangement to transfer heat from the power electronic module to the cooling arrangement, the thermal interface material comprises a metal foil and a solid lubricant coating.

2. A power electronic assembly according to claim 1, wherein the metal foil is an aluminium foil.

3. A power electronic assembly according to claim 2, wherein the solid lubricant coating comprises polytetrafluoroethylene.

4. A power electronic assembly according to claim 1, wherein the solid lubricant coating comprises a carbon based material.

5. A power electronic assembly according to claim 1, wherein the solid lubricant coating comprises polytetrafluoroethylene.

6. A power electronic assembly according to claim 1, wherein the solid lubricant coating is arranged on the surface of the metal foil.

7. A power electronic assembly according to claim 1, wherein the solid lubricant coating is arranged on the bottom surface of the base plate.

8. A power electronic assembly according to claim 1, wherein the thickness of the metal foil is in in the range of 100 μm to 300 μm.

9. A power electronic assembly according to claim 1, wherein the thickness of the solid lubricant coating is in the range of 5 μm to 20 μm.

10. A power electronic assembly according to claim 1, wherein the solid lubricant coating is arranged between the surface of the metal foil and the bottom surface of the base plate.

11. A power electronic assembly according to claim 1, wherein at least one of the multiple of semiconductor power electronic components of the power electronic module is rated to a current in the range of hundreds of amperes.

12. A power electronic assembly according to claim 1, wherein the length of the bottom surface of the power electronic module is in the range of over 100 millimeters.

13. A power electronic assembly according to claim 1, wherein the solid lubricant coating comprises one of a carbon based material or a polytetrafluoroethylene;
    wherein the thickness of the metal foil is in the range of 100 μm to 300 μm; and
    wherein the solid lubricant coating is arranged between the surface of the metal foil and the bottom surface of the base plate.

14. A power electronic assembly according to claim 13, wherein at least one of the multiple of semiconductor power electronic components of the power electronic module is rated to a current in the range of hundreds of amperes; and
    wherein the length of the bottom surface of the power electronic module is over 100 millimeters.

15. The power electronic assembly according to claim 1, wherein the solid lubricant coating is graphite.

16. The power electronic assembly according to claim 1, wherein solid lubricant coating is graphite;
    wherein the solid lubricant coating is arranged on the surface of the metal foil;
    wherein the thickness of the metal foil is in in the range of 100 μm to 300 μm; and
    wherein the thickness of the solid lubricant coating is in the range of 5 μm to 20 μm.

17. A power electronic device comprising:
    one or more power electronic assemblies comprising:
    a power electronic assembly comprising a power electronic module incorporating multiple of semiconductor power electronic switch components, the power electronic module comprising a base plate with a bottom surface,
    the power electronic assembly comprises further a cooling arrangement for cooling the power electronic module, the cooling arrangement comprising a cooling surface adapted to be attached against the bottom surface of the base plate of the power electronic module, wherein
    the power electronic assembly comprises further a thermal interface material arranged between the bottom surface of the base plate of the power electronic module and the cooling surface of the cooling arrangement to transfer heat from the power electronic module to the cooling arrangement, the thermal interface material comprises a metal foil and a solid lubricant coating.

18. A power electronic device according to claim 17, wherein the power electronic device is a frequency converter.

19. The power electronic device according to claim 17, wherein the one or more power electronic assemblies is defined by a plurality of power electronic assemblies.

* * * * *